US012132156B2

(12) United States Patent
Ruan et al.

(10) Patent No.: US 12,132,156 B2
(45) Date of Patent: Oct. 29, 2024

(54) DISPLAY DEVICE AND MANUFACTURING METHOD THEREOF

(71) Applicant: Au Optronics Corporation, Hsinchu (TW)

(72) Inventors: Cheng-He Ruan, Hsinchu (TW); Jian-Jhou Tseng, Hsinchu (TW); Chih-Yuan Hou, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 442 days.

(21) Appl. No.: 17/512,649

(22) Filed: Oct. 27, 2021

(65) Prior Publication Data

US 2022/0367767 A1 Nov. 17, 2022

(30) Foreign Application Priority Data

May 17, 2021 (TW) .................................. 110117818

(51) Int. Cl.
*H01L 33/56* (2010.01)
*H01L 25/075* (2006.01)
*H01L 33/48* (2010.01)
*H01L 33/62* (2010.01)

(52) U.S. Cl.
CPC .......... *H01L 33/56* (2013.01); *H01L 25/0753* (2013.01); *H01L 33/62* (2013.01); *H01L 2933/005* (2013.01)

(58) Field of Classification Search
CPC .......... H01L 25/0753; H01L 2933/005; H01L 33/56; H01L 33/62
See application file for complete search history.

(56) References Cited

U.S. PATENT DOCUMENTS

| 10,381,523 | B2 | 8/2019 | Liu et al. | |
| 10,431,637 | B2* | 10/2019 | Jin | G06F 3/04164 |
| 10,896,945 | B2* | 1/2021 | Managaki | H10K 50/844 |
| 11,239,304 | B2 | 2/2022 | Park et al. | |
| 2006/0158111 | A1* | 7/2006 | Hayashi | H10K 50/8426 428/917 |
| 2012/0268899 | A1* | 10/2012 | Haba | H01L 24/96 361/728 |
| 2017/0194533 | A1 | 7/2017 | Liu et al. | |
| 2018/0053810 | A1 | 2/2018 | Jin et al. | |
| 2020/0194534 | A1 | 6/2020 | Park et al. | |
| 2021/0055816 | A1* | 2/2021 | An | H10K 50/844 |
| 2022/0123098 | A1 | 4/2022 | Park et al. | |

FOREIGN PATENT DOCUMENTS

| CN | 106972013 | 7/2017 |
| CN | 107180852 | 9/2017 |
| CN | 111326554 | 6/2020 |
| CN | 211125656 | 7/2020 |
| CN | 111785847 | 10/2020 |

* cited by examiner

*Primary Examiner* — Walter H Swanson
*Assistant Examiner* — Jacob T Nelson
(74) *Attorney, Agent, or Firm* — JCIPRNET

(57) ABSTRACT

A display device includes a flexible substrate, a bonding pad, a light-emitting diode, an encapsulant, and a support structure. The bonding pad and the light-emitting diode are located on the flexible substrate. The encapsulant covers the light-emitting diode. The support structure is laterally located between the light-emitting diode and the bonding pad. The support structure has an inclined surface, and a thickness of the support structure close to the light-emitting diode is greater than the thickness of the support structure close to the bonding pad.

9 Claims, 9 Drawing Sheets

DISPLAY DEVICE AND MANUFACTURING METHOD THEREOF

CROSS-REFERENCE TO RELATED APPLICATION

This application claims the priority benefit of Taiwan application serial no. 110117818, filed on May 17, 2021. The entirety of the above-mentioned patent application is hereby incorporated by reference herein and made a part of this specification.

BACKGROUND OF THE INVENTION

Field of the Invention

The invention relates to a display device, and more particularly to a display device including a light-emitting diode and a manufacturing method thereof.

Description of Related Art

The light-emitting diode is a type of electroluminescent semiconductor element that has advantages such as high efficiency, long life, resistance to damage, fast response speed, and high reliability. With the investment of a lot of time and money, the size of light-emitting diodes has been shrinking year by year. In order to protect these tiny light-emitting diodes, packaging techniques are usually adopted to cover the light-emitting diodes with a packaging material. The packaging material of the light-emitting diodes includes, for example, silicone. Generally speaking, the packaging material needs to have a sufficient thickness to ensure that the packaging material may completely cover the light-emitting diodes.

SUMMARY OF THE INVENTION

The invention provides a display device that may alleviate the issue of bubbles in the display device.

The invention provides a manufacturing method of a display device that may alleviate the issue of bubbles in the display device.

At least one embodiment of the invention provides a display device. The display device includes a flexible substrate, a bonding pad, a light-emitting diode, an encapsulant, and a support structure. The bonding pad and the light-emitting diode are located on the flexible substrate. The encapsulant covers the light-emitting diode. The support structure is laterally located between the light-emitting diode and the bonding pad. The support structure has an inclined surface, and a thickness of the support structure close to the light-emitting diode is greater than the thickness of the support structure close to the bonding pad.

At least one embodiment of the invention provides a manufacturing method of a display device, including: providing a pixel circuit on a rigid carrier board, the pixel circuit including a flexible substrate and a bonding pad and a light-emitting diode located on the flexible substrate; forming an encapsulant material on the pixel circuit to cover the light-emitting diode; curing the encapsulant material to form an encapsulant; forming a support structure material on the pixel circuit, wherein the support structure material is laterally located between the light-emitting diode and the bonding pad; curing the support structure material to form a support structure, wherein the support structure has an inclined surface, and a thickness of the support structure close to the light-emitting diode is greater than the thickness of the support structure close to the bonding pad; providing a protective layer on the inclined surface of the support structure and the encapsulant; removing the rigid carrier board; and adhering the pixel circuit on a flexible carrier board.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1L are cross-sectional views of a manufacturing method of a display device according to an embodiment of the invention. FIG. 2 is a schematic top view of a display device according to an embodiment of the invention, wherein FIG. 1L corresponds to the position of line A-A' of FIG. 2.

Figure 1A:
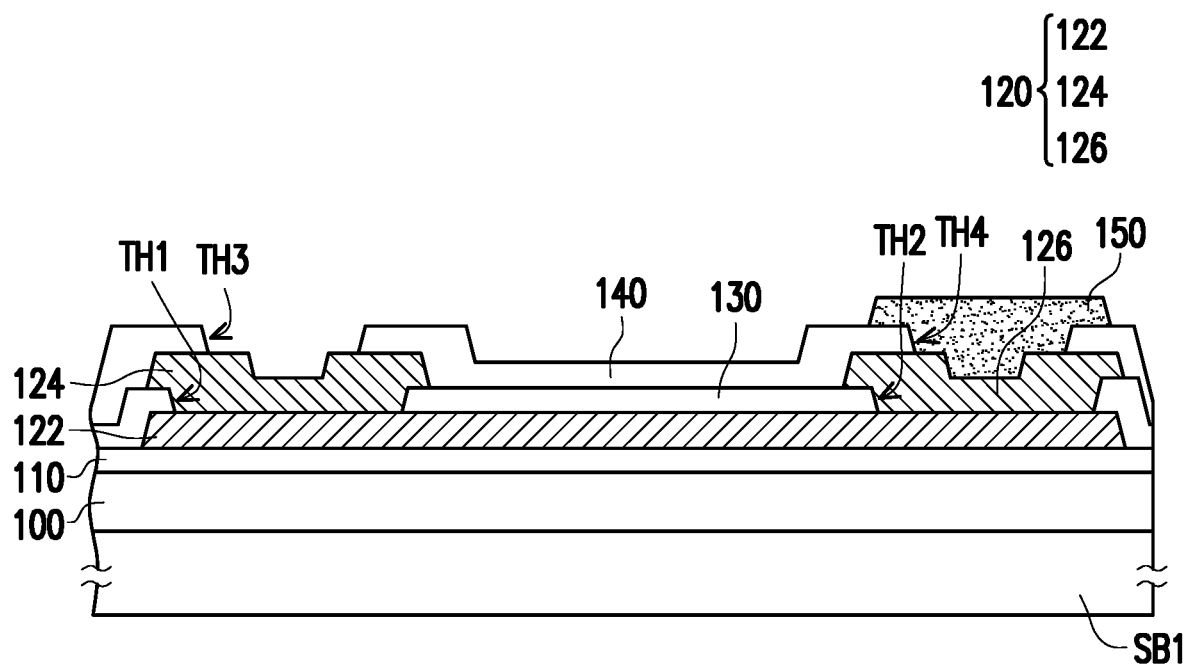
FIG. 1A to FIG. 1L are cross-sectional views of a manufacturing method of a display device according to an embodiment of the invention.
Figure 1B:
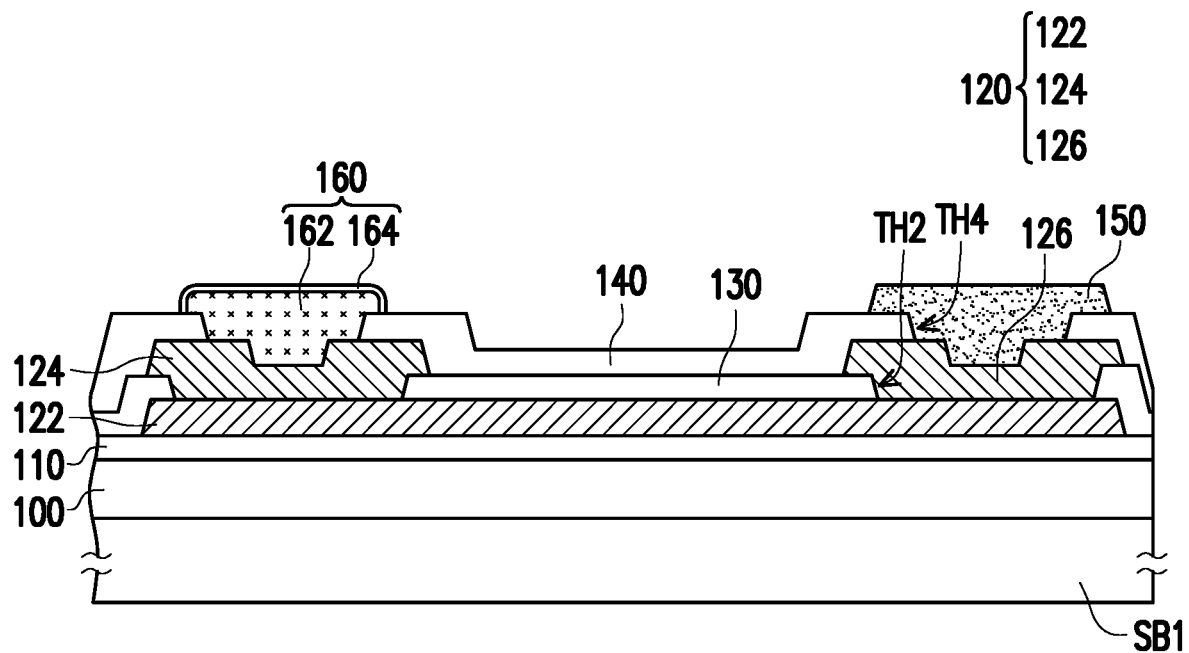
Figure 1C:
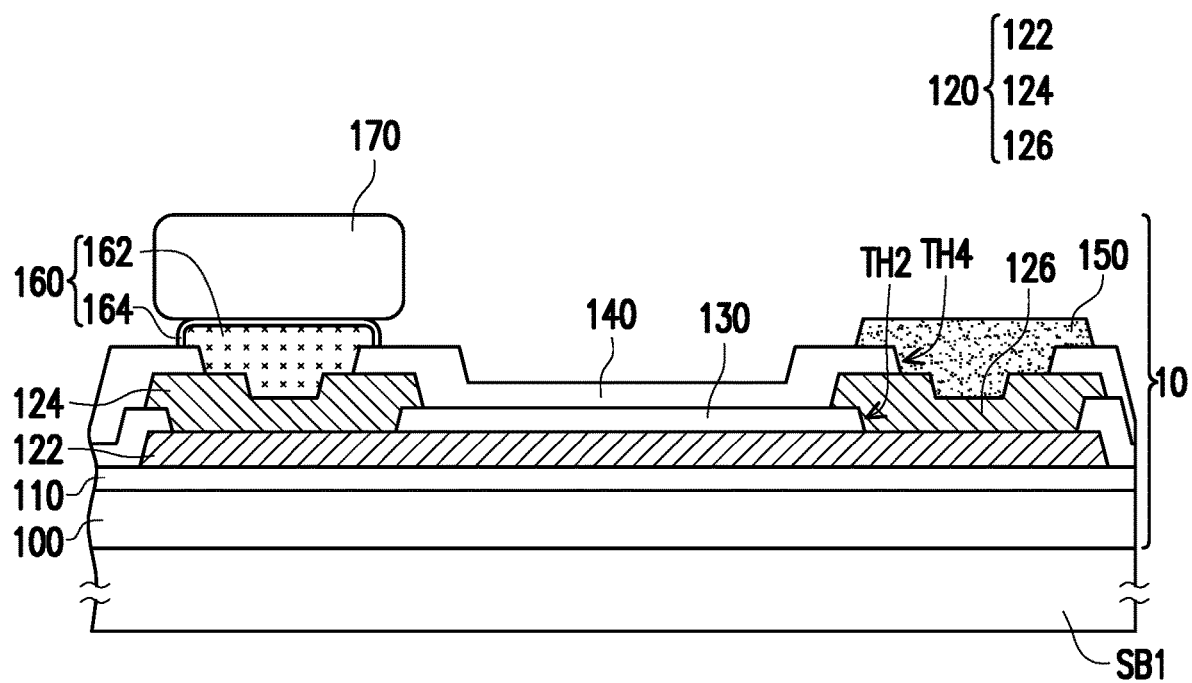
Figure 2:
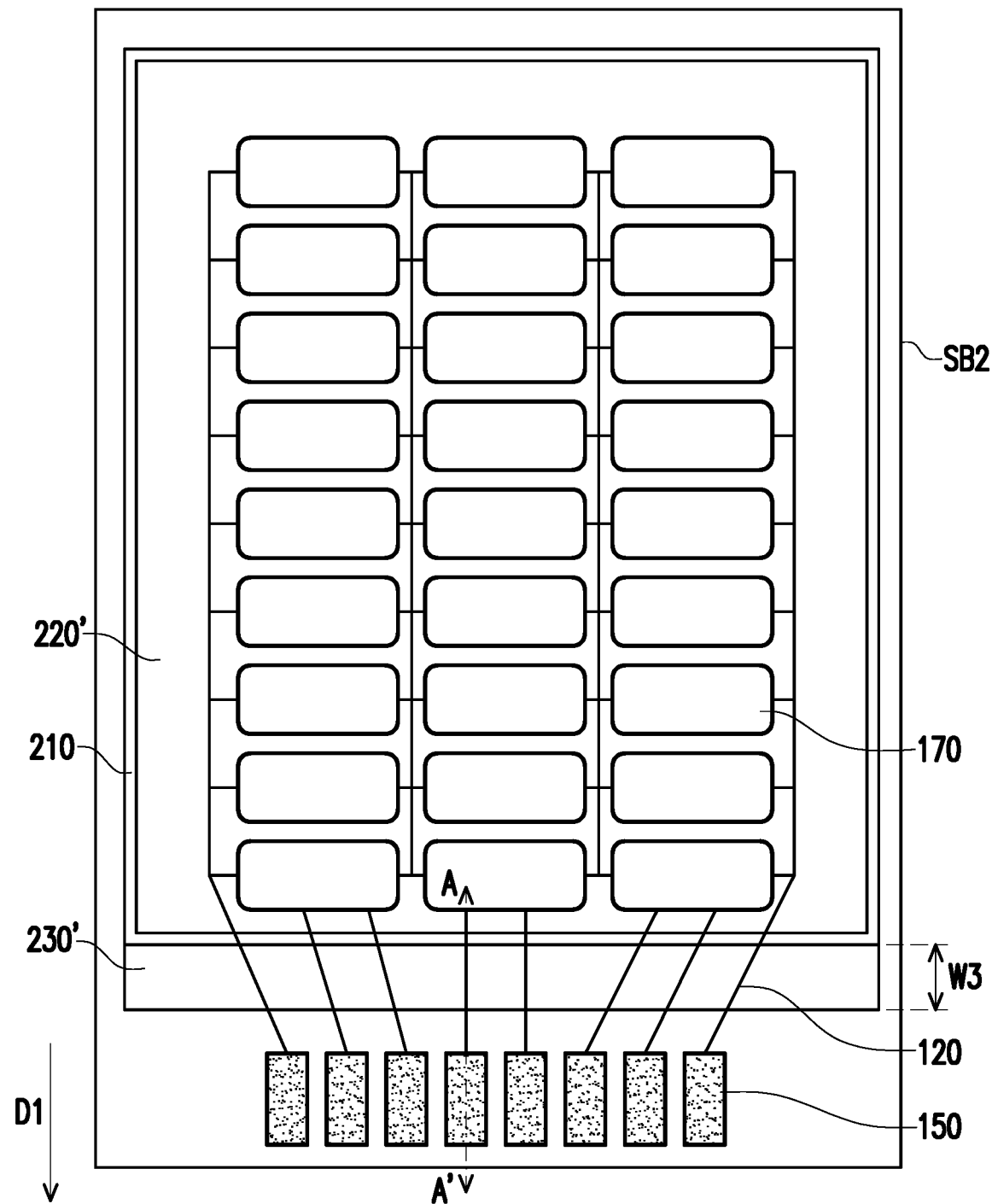
FIG. 2 is a top view of a display device according to an embodiment of the invention.

Referring to FIG. 1A to FIG. 1C, a pixel circuit 10 is provided on a rigid carrier board SB1. The pixel circuit 10 includes a flexible substrate 100 and a bonding pad 150 and a light-emitting diode 170 on the flexible substrate 100. In the present embodiment, the pixel circuit 10 further includes a first insulating layer 110, a signal line 120, a second insulating layer 130, and a third insulating layer 140.

Please refer to FIG. 1A, the flexible substrate 100 is formed on the rigid carrier board SB1. The rigid carrier board SB1 includes, for example, a glass substrate, a sapphire substrate, a metal substrate, a wafer, a ceramic, or other suitable substrates. The material of the flexible substrate 100 includes, for example, polyamide (PA), polyimide (PI), poly(methyl methacrylate) (PMMA), polyethylene naphthalate (PEN), polyethylene terephthalate (PET), fiber reinforced plastics (FRP), polyetheretherketone (PEEK), epoxy resin, or other suitable materials or a combination of at least two of the above, but the present embodiment is not limited thereto.

The first insulating layer 110 is formed on the flexible substrate 100. The material of the first insulating layer 110 contains an inorganic material (such as: silicon oxide, silicon nitride, silicon oxynitride, other suitable materials, or stacked layers of at least two materials thereof), an organic material, other suitable materials, or a combination of the above materials.

The signal line 120 is formed on the first insulating layer 110. The signal line 120 may be a single layer or multi-layer structure. In the present embodiment, the signal line 120 has a multi-layer structure and includes a wiring 122, an electrode 124, and a transfer electrode 126, wherein the electrode 124 and the transfer electrode 126 are formed on the wiring 122. In the present embodiment, the second insulating layer 130 is formed on the wiring 122 and has a first through hole TH1 and a second through hole TH2 overlapped with the wiring 122. The electrode 124 and the transfer electrode 126 are formed on the second insulating layer 130, and are connected to the wiring 122 via the first through hole TH1 and the second through hole TH2, respectively.

The material of the second insulating layer 130 contains an inorganic material (such as: silicon oxide, silicon nitride, silicon oxynitride, other suitable materials, or stacked layers of at least two materials thereof), an organic material, other suitable materials, or a combination of the above materials.

The material of the wiring 122, the electrode 124, and the transfer electrode 126 includes metal, nitride of a metal material, oxide of a metal material, oxynitride of a metal material, or other suitable conductive materials, or stacked layers of metal materials and other conductive materials.

In the present embodiment, the wiring 122 includes, for example, a fanout line. In some embodiments, the structure of the signal line 120 is not limited to the structure of FIG. 1A. For example, the wiring 122 of the signal line 120 may be a discontinuous structure, and the discontinuous wiring 122 is electrically connected to each other via other bridge structures (not shown). Via the design of a bridge structure, the wiring 122 may span cross other circuits with different directions.

The third insulating layer 140 is formed on the signal line 120 and the second insulating layer 130, and has a third through hole TH3 and a fourth through hole TH4 overlapped with the electrode 124 and the transfer electrode 126, respectively. The material of the third insulating layer 140 contains an inorganic material (such as: silicon oxide, silicon nitride, silicon oxynitride, other suitable materials, or stacked layers of at least two materials thereof), an organic material, other suitable materials, or a combination of the above materials.

The bonding pad 150 is formed on the third insulating layer 140 and is connected to the transfer electrode 126 via the fourth through hole TH4. The material of the bonding pad 150 includes indium tin oxide, but the invention is not limited thereto. In some embodiments, the material of the bonding pad 150 includes metal, nitride of a metal material, oxide of a metal material, oxynitride of a metal material, or other suitable conductive materials, or stacked layers of metal materials and other conductive materials.

Referring to FIG. 1B, a connecting structure 160 is optionally formed on the electrode 124. The connecting structure 160 may be a single layer or multi-layer structure. In the present embodiment, the connecting structure 160 is a multi-layer structure and includes at least a first layer 162 and a second layer 164. In some embodiments, the method of forming the connecting structure 160 includes electroless nickel immersion gold (ENIG), electroless nickel electroless palladium immersion gold (ENEPIG), or other suitable methods, but the invention is not limited thereto.

Please refer to FIG. 1C to electrically connect the light-emitting diode 170 to the electrode 124. In some embodiments, a low melting point metal (such as tin, indium, bismuth, tin-bismuth mixed metal, tin-indium mixed metal, tin-copper mixed metal, tin-silver mixed metal, tin-antimony mixed metal, tin-zinc mixed metal, tin-silver-copper mixed metal, tin-silver-copper-bismuth mixed metal, or a combination or stack of the above materials) is formed on the light-emitting diode 170 or the connecting structure 160. The light-emitting diode 170 is bonded to the connecting structure 160 in a eutectic manner by heating the above low melting point metal. The method of heating the above low melting point metal includes, for example, a hot press process, a laser process, or other suitable processes. In other embodiments, the light-emitting diode 170 is electrically connected to the electrode 124 via an anisotropic conductive film (ACF). In other words, the connecting structure 160 may also be anisotropic conductive adhesive.

FIG. 1A to FIG. 1L and FIG. 2 only illustrate that the light-emitting diode 170 is electrically connected to one bonding pad 150 via one signal line 120, but the invention is not limited thereto. Each of the light-emitting diodes 170 includes two pads, and the two pads of each of the light-emitting diodes 170 respectively correspond to the cathode and the anode of the light-emitting diode 170. The cathode and the anode of the light-emitting diode 170 are electrically connected to different signal lines 120 respectively, and are electrically connected to different bonding pads 150 via the different signal lines 120. In some embodiments, the light-emitting diode 170 is a horizontal light-emitting diode or a vertical light-emitting diode. In some embodiments, the pads of the light-emitting diode 170 are located at a side of the light-emitting diode 170 facing away from the signal line 120. Therefore, other conductive structures are formed on the light-emitting diode 170 so that the pads are electrically connected to the corresponding signal line 120.

Figure 1D:
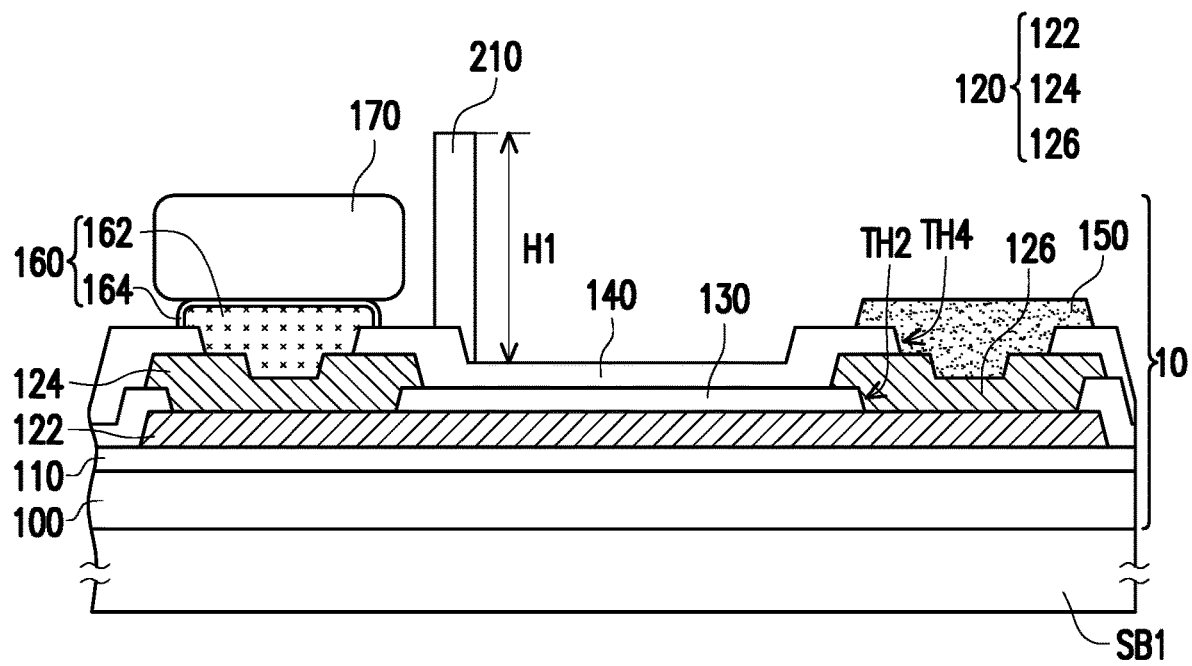

Referring to FIG. 1D, a retaining wall 210 is formed on the pixel circuit 10. In the present embodiment, the retaining wall 210 is formed at the third insulating layer 140, and the retaining wall 210 surrounds a plurality of light-emitting diodes 170 (please refer to FIG. 2). The material of the retaining wall 210 includes, for example, an organic material (for example, poly(methyl methacrylate) (PMMA)), a ceramic material, or other suitable materials. In some embodiments, a retaining wall adhesive is formed on the pixel circuit 10, and the viscosity of the retaining wall adhesive is 200000 cps to 500000 cps, and then the retaining wall adhesive is cured to obtain the retaining wall 210. In the present embodiment, the top surface of the retaining wall 210 is higher than the top surface of the light-emitting diode 170, and a thickness H1 of the retaining wall 210 is, for example, 300 μm to 150 μm.

Figure 1E:
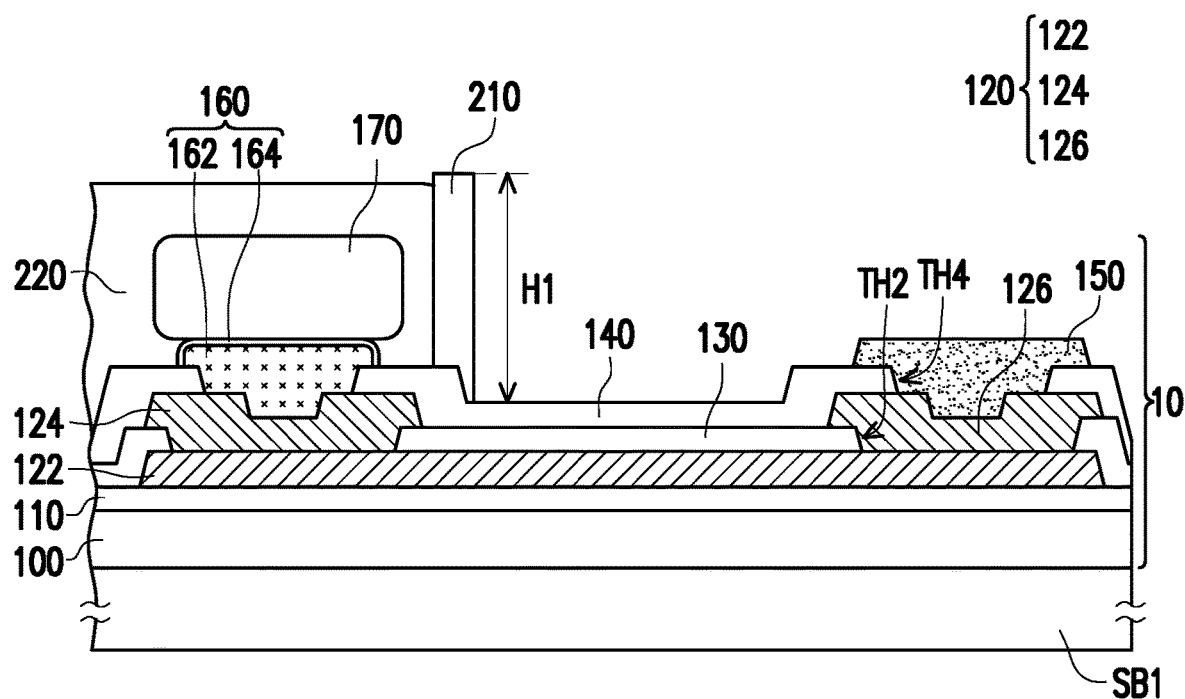

Referring to FIG. 1E, an encapsulant material 220 is formed on the pixel circuit 10 to cover the light-emitting diode 170. In the present embodiment, the encapsulant material 220 is formed in the area surrounded by the retaining wall 210. The encapsulant material 220 includes, for example, silicone, and the silicone may include methyl and/or phenyl. In some embodiments, the viscosity of the encapsulant material 220 is less than 10000 cps, for example, 5000 cps to 10000 cps. As a result, the encapsulant material 220 may be more readily filled in tiny gaps to prevent bubbles from appearing around the light-emitting diode 170.

Figure 1F:
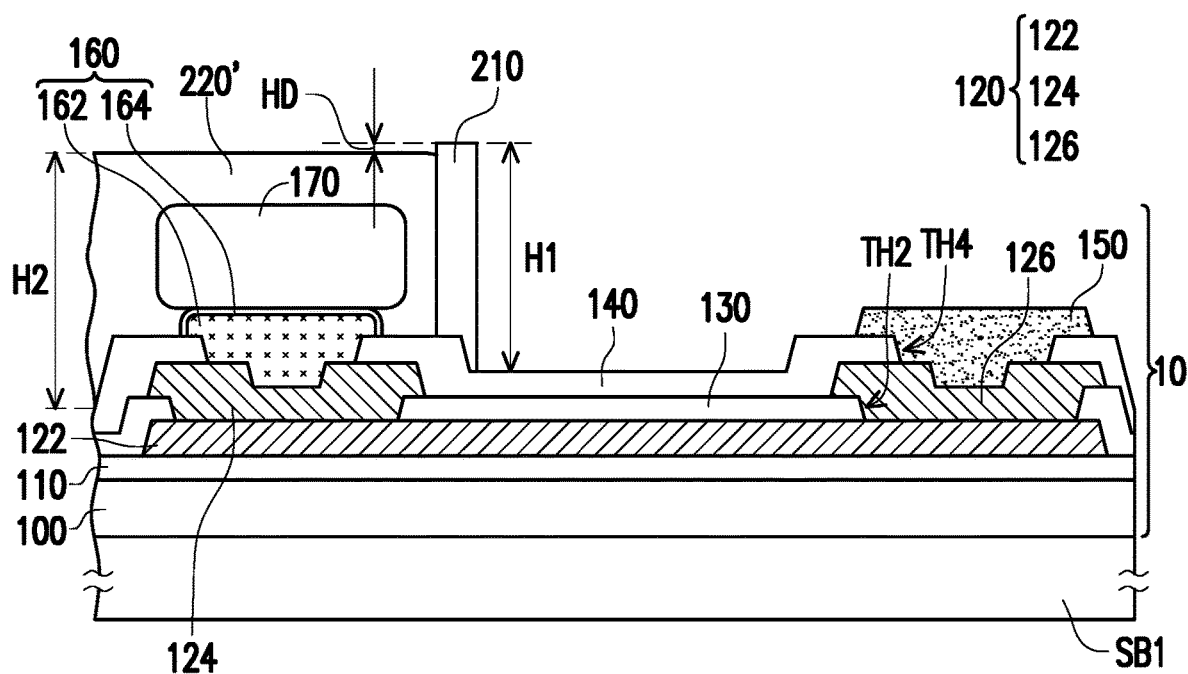

Referring to FIG. 1F, the encapsulant material 220 is cured to form an encapsulant 220', wherein the encapsulant 220' covers the light-emitting diode 170. The refractive index of the encapsulant 220' is about 1.4 to 1.5. In some embodiments of the invention, a thickness H2 of the encapsulant 220' is 150 μm to 350 μm. In the present embodiment, the retaining wall 210 surrounds the encapsulant 220', and the thickness H1 of the retaining wall 210 is greater than, equal to, or less than the thickness H2 of the encapsulant 220'. In the present embodiment, the top surface of the retaining wall 210 is higher than the top surface of the encapsulant 220', and the top surface of the retaining wall 210 and the top surface of the encapsulant 220' have a height difference HD. In some embodiments, curing the encapsulant material 220 volatilizes the solvent in the encapsulant material 220. Therefore, the thickness of the encapsulant 220' is slightly lower than the thickness of the encapsulant material 220.

Figure 1G:
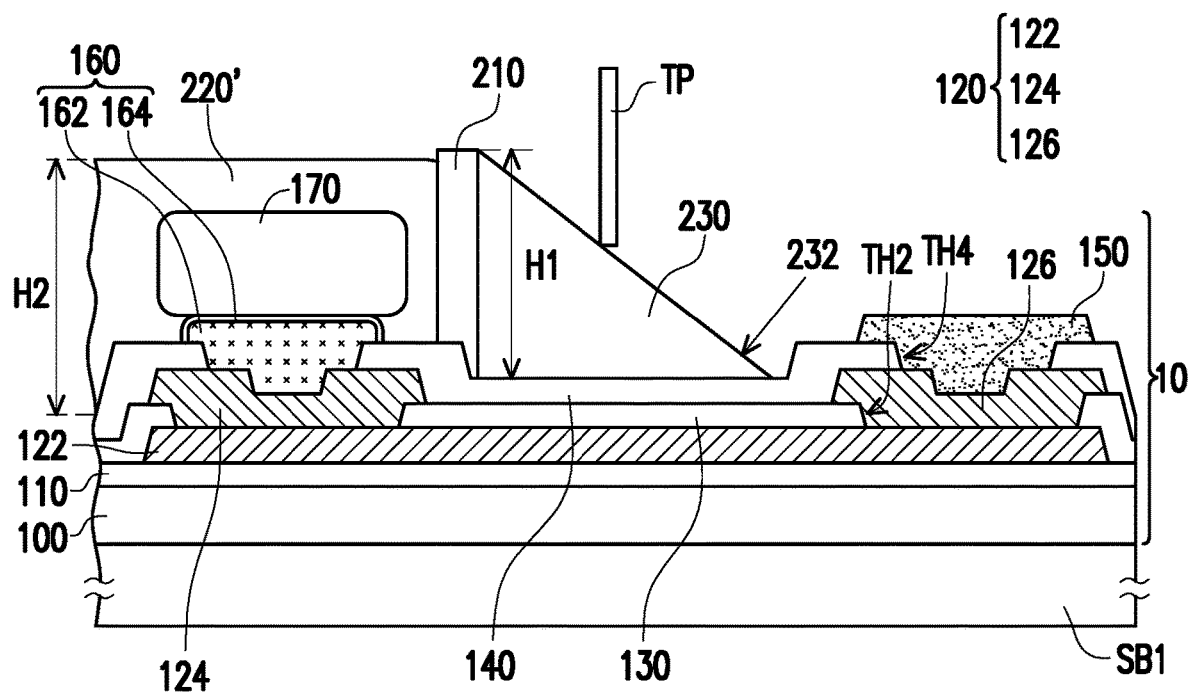

Referring to FIG. 1G, a support structure material 230 is formed on the pixel circuit 10, wherein the support structure material 230 is laterally located between the light-emitting diode 170 and the bonding pad 150. In some embodiments, the method of forming the support structure material 230 on the pixel circuit 10 includes a doctor blade forming method. In the doctor blade forming method, for example, a doctor blade TP slides over the support structure material 230, thereby forming an inclined surface 232 of the support structure material 230. In some embodiments, the viscosity of the support structure material 230 is greater than the viscosity of the encapsulant material 220. Therefore, there is no high fluidity to stop the support structure material 230 from forming the inclined surface 232. In some embodiments, the viscosity of the support structure material 230 is greater than 300000 cps, for example, 300000 cps to 500000 cps.

In some embodiments, the material of the support structure material 230 includes, for example, an organic material (for example, poly(methyl methacrylate) (PMMA)), a ceramic material, or other suitable materials. In some embodiments, the support structure material 230 includes the same material as the retaining wall adhesive, for example.

Figure 1H:
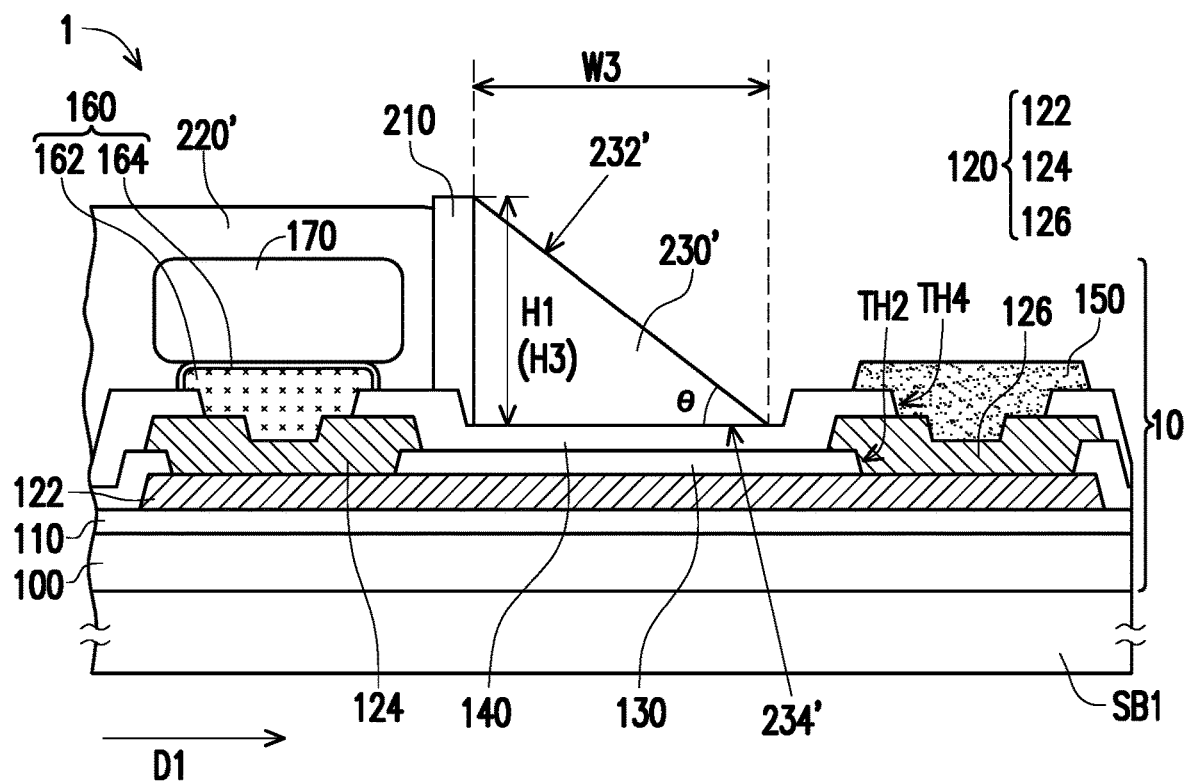

Referring to FIG. 1H, the support structure material 230 is cured to form a support structure 230', wherein the support structure 230' has an inclined surface 232'. The retaining wall 210 is located between the support structure 230' and the encapsulant 220'. In the present embodiment, the retaining wall 210 is in direct contact with the support structure 230'. In the present embodiment, the retaining wall 210 and the support structure 230' are formed separately, and there is an interface between the retaining wall 210 and the support structure 230'.

In the present embodiment, with the provision of the inclined surface 232', the thickness of the support structure 230' close to the light-emitting diode 170 is greater than the thickness of the support structure 230' close to the bonding pad 150. In the present embodiment, a maximum thickness H3 of the support structure 230' is 150 μm to 350 μm. The thickness H1 of the retaining wall 210 is substantially equal to the maximum thickness H3 of the support structure 230'. In the present embodiment, the top surface of the retaining wall 210 is connected to the inclined surface 232' of the support structure 230'.

In the present embodiment, the support structure 230' is located between the bonding pad 150 and the light-emitting diode 170 in a first direction D1, and a width W3 of the support structure 230' in the first direction D1 is greater than the maximum thickness H3 of the support structure 230'. In the present embodiment, the width W3 of the support structure 230' is 1500 μm to 3000 μm. The width W3 of the support structure 230' is, for example, ten times or more than the thickness H3.

In the present embodiment, an included angle θ between the inclined surface 232' of the support structure 230' and a bottom surface 234' of the support structure 230' is greater than 0 degrees and less than or equal to 30 degrees, and the included angle θ is preferably from greater than or equal to 5 degrees to less than or equal to 10 degrees.

In the present embodiment, a display device 1 includes the pixel circuit 10, the encapsulant 220', a retaining wall 210, and the support structure 230'.

Figure 1I:
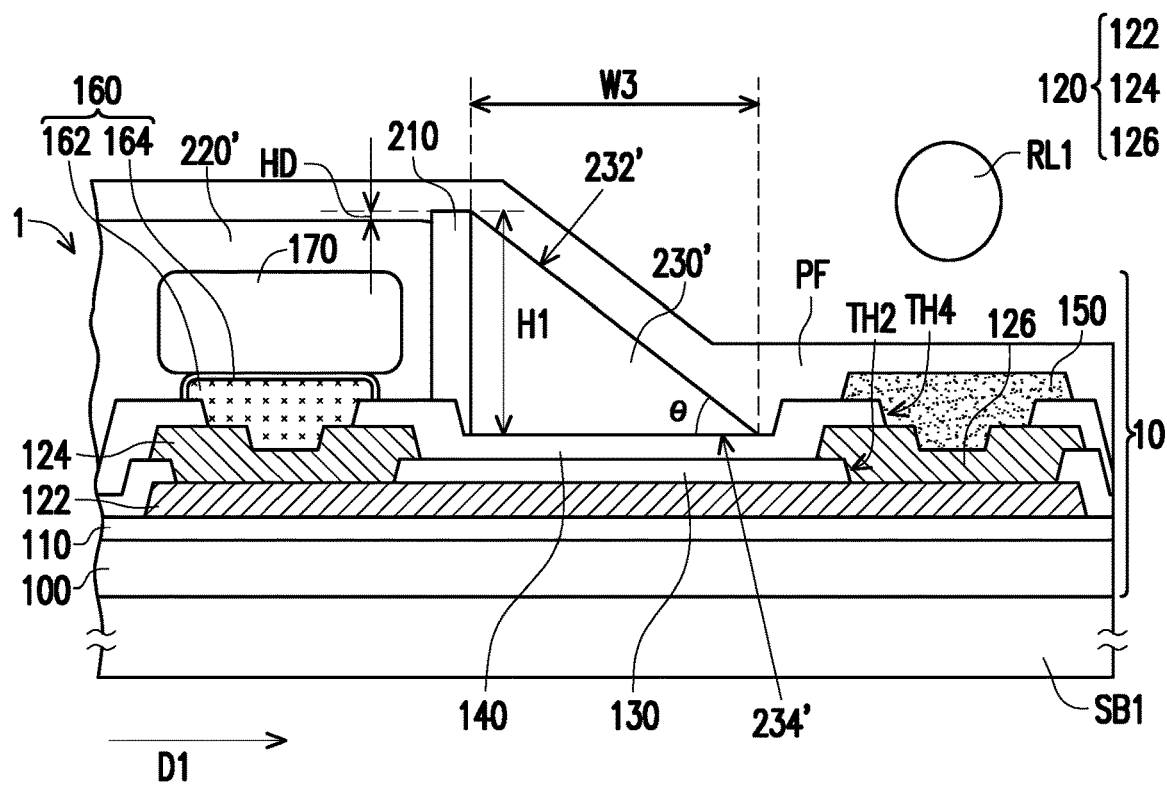

Referring to FIG. 1I, a protective layer PF is adhered to the display device 1. In the present embodiment, the protective layer PF is provided on the inclined surface 232' of the support structure 230' and the encapsulant 220'. In the present embodiment, the protective layer PF covers the retaining wall 210, the encapsulant 220', the inclined surface 232' of the support structure 230', and the bonding pad 150. The protective layer PF is adhered to the retaining wall 210, the encapsulant 220', the inclined surface 232' of the support structure 230', and the bonding pad 150, for example, via a roller RL1.

The top surface of the retaining wall 210 is not flush with the top surface of the pixel circuit 10. Therefore, if the support structure 230' is not provided, a gap is readily formed between the protective layer PF and the pixel circuit 10 due to the step between the top surface of the retaining wall 210 and the top surface of the pixel circuit 10. In other words, in the present embodiment, by providing the support structure 230', a gap between the protective layer PF and the pixel circuit 10 is avoided.

The protective layer PF is, for example, an adhesive tape, and the material thereof includes polyethylene terephthalate (PET), polyethylene naphthalate (PEN), polycarbonate (PC), cyclic olefin copolymer (COC), cellulose triacetate (TAC), fiber-reinforced plastic (FRP), or other similar materials. The adhesive surface of the protective layer PF faces the display device 1.

Figure 1J:
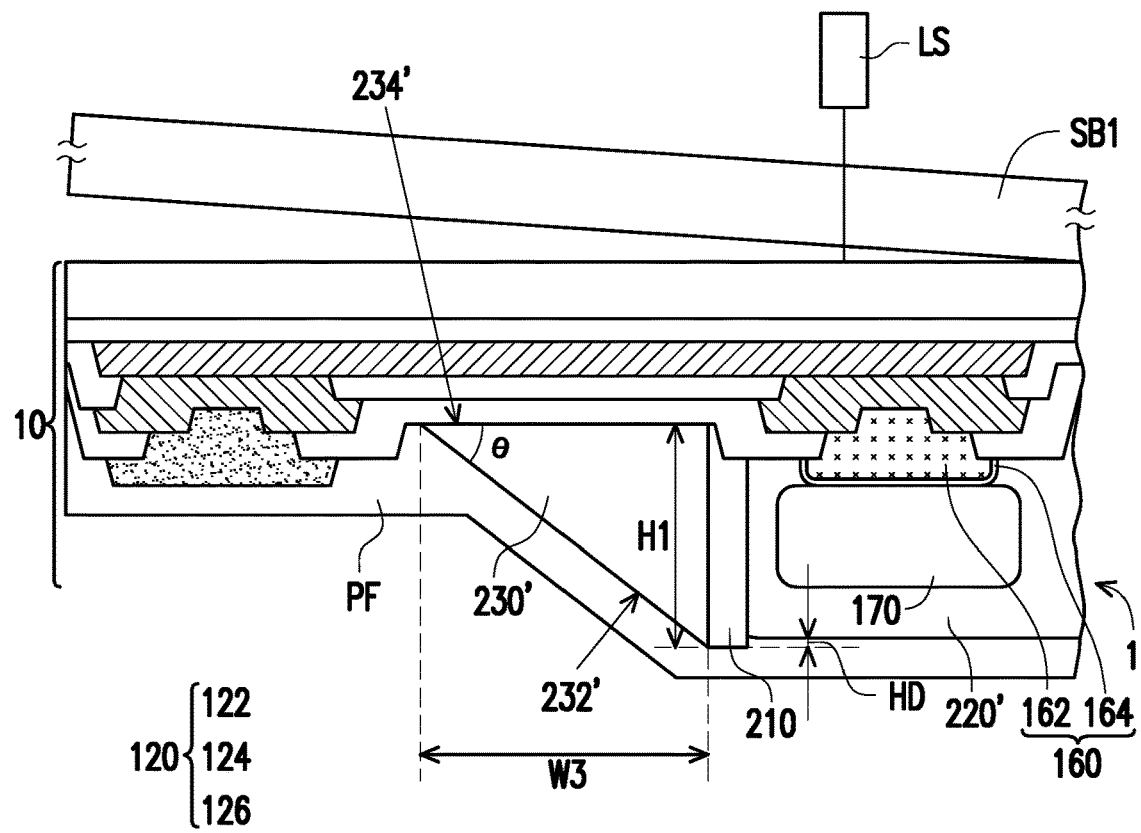

Referring to FIG. 1J, the rigid carrier board SB1 is removed. In the present embodiment, the pixel circuit 10 is irradiated with a laser LS from the bottom surface of the rigid carrier board SB1, thereby separating the rigid carrier board SB1 from the pixel circuit 10.

Figure 1K:
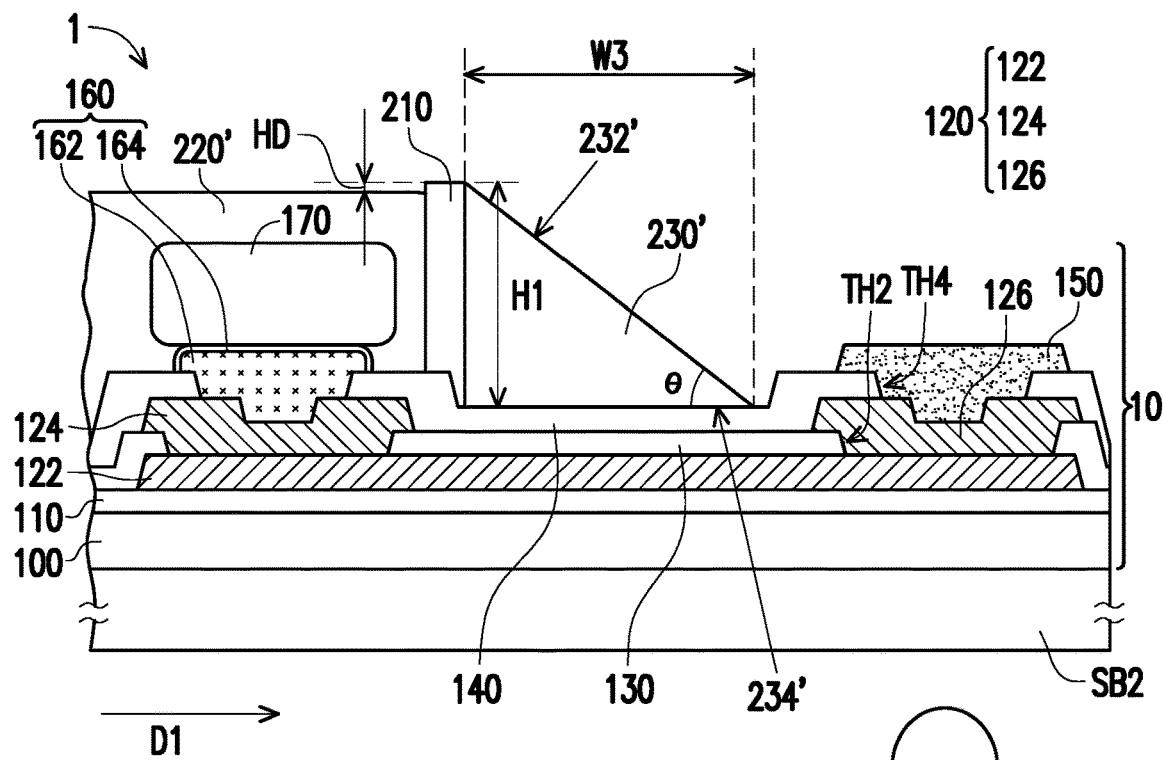

Referring to FIG. 1K, a flexible carrier board SB2 is adhered to the display device 1. In the present embodiment, the flexible carrier board SB2 is provided on the flexible substrate 100. In the present embodiment, the flexible carrier board SB2 covers the bottom surface of the flexible substrate 100. The flexible carrier board SB2 is adhered to the bottom surface of the flexible substrate 100 via, for example, a roller RL2. In some embodiments, the flexible carrier board SB2 is, for example, an adhesive tape, and the material thereof includes polyethylene terephthalate (PET), polyethylene naphthalate (PEN), polycarbonate (PC), cyclic olefin copolymer (COC), cellulose triacetate (TAC), fiber-reinforced plastic (FRP), or other similar materials.

In the present embodiment, since the support structure 230' reduces the gap between the protective layer PF and the pixel circuit 10, when the flexible carrier board SB2 is adhered to the flexible substrate 100, the flexible substrate 100 is not deformed by the gap between the protective layer PF and the pixel circuit 10, thus further avoiding the formation of a gap between the flexible carrier board SB2 and the flexible substrate 100.

Figure 1L:
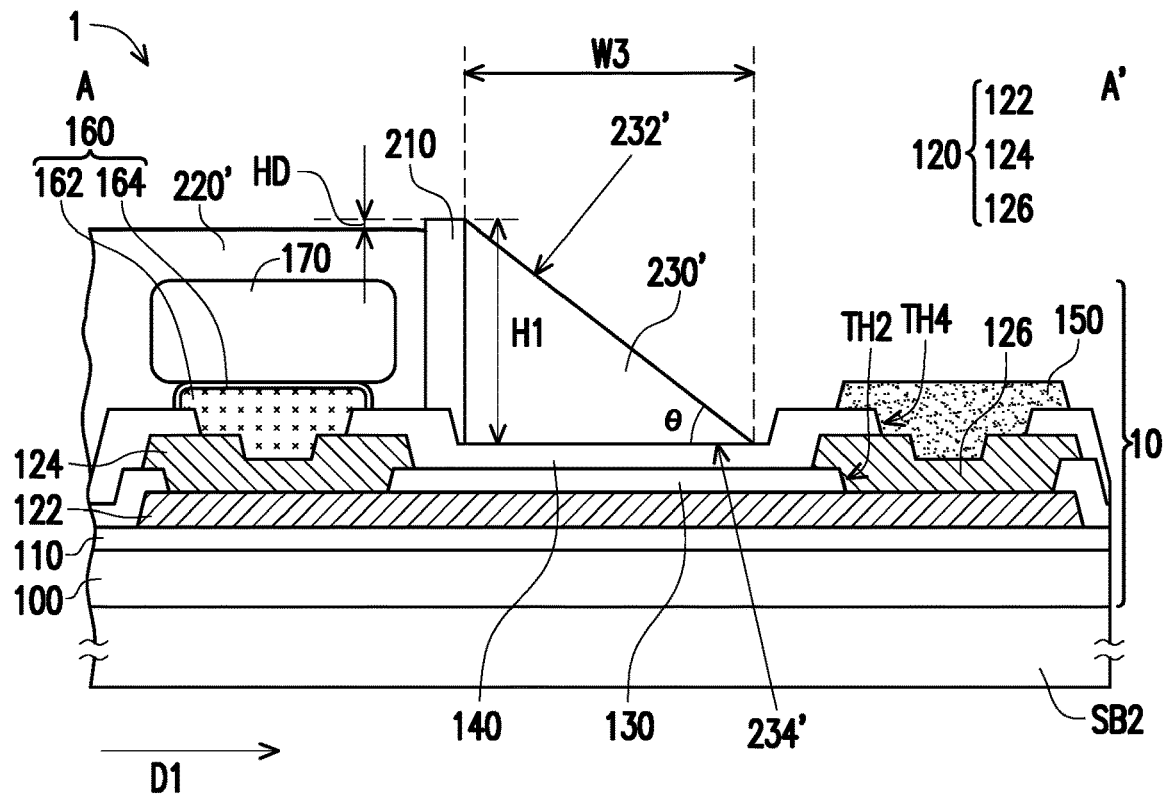

Referring to FIG. 1L and FIG. 2, the protective layer PF is removed. In some embodiments, the adhesion of the flexible carrier board SB2 to the display device 1 is greater than the adhesion of the protective layer PF to the display device 1. Therefore, when the protective layer PF is removed, the display device 1 remains on the flexible carrier board SB2.

Figure 3:
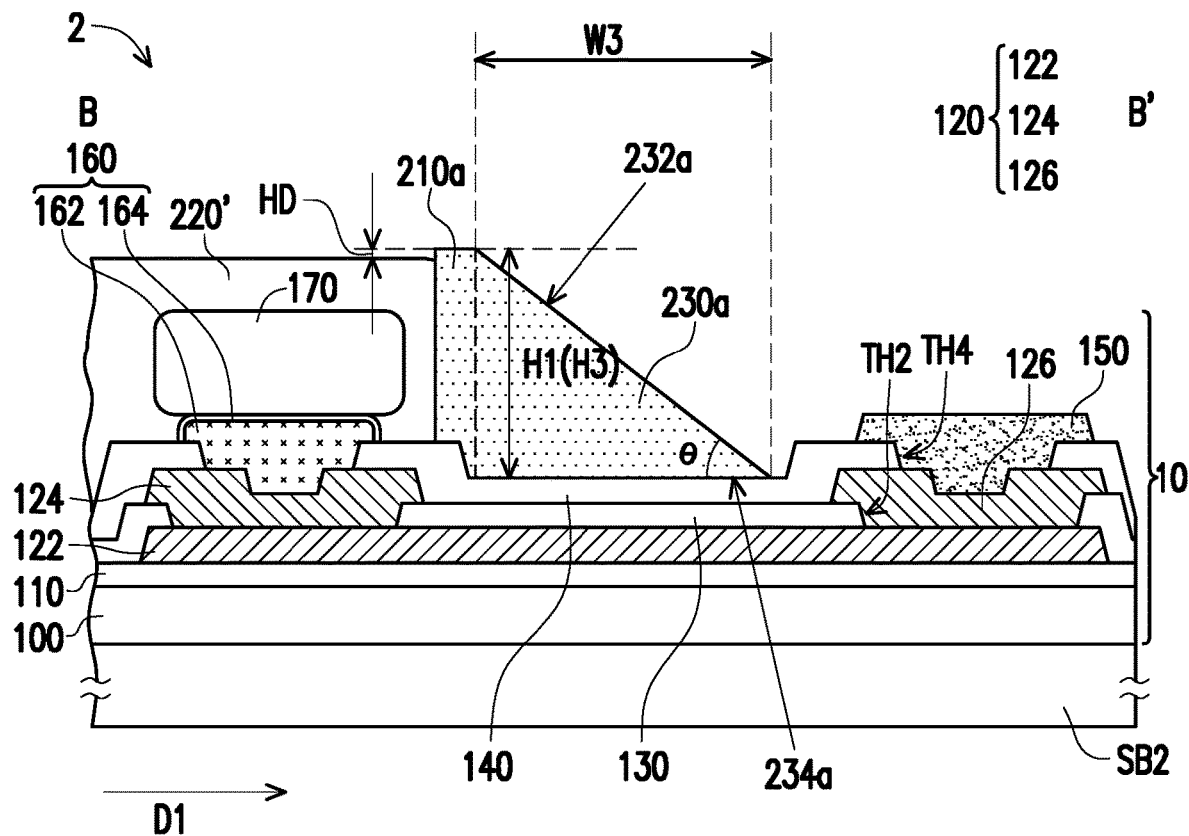
FIG. 3 is a cross-sectional view of a display device according to an embodiment of the invention.
Figure 4:
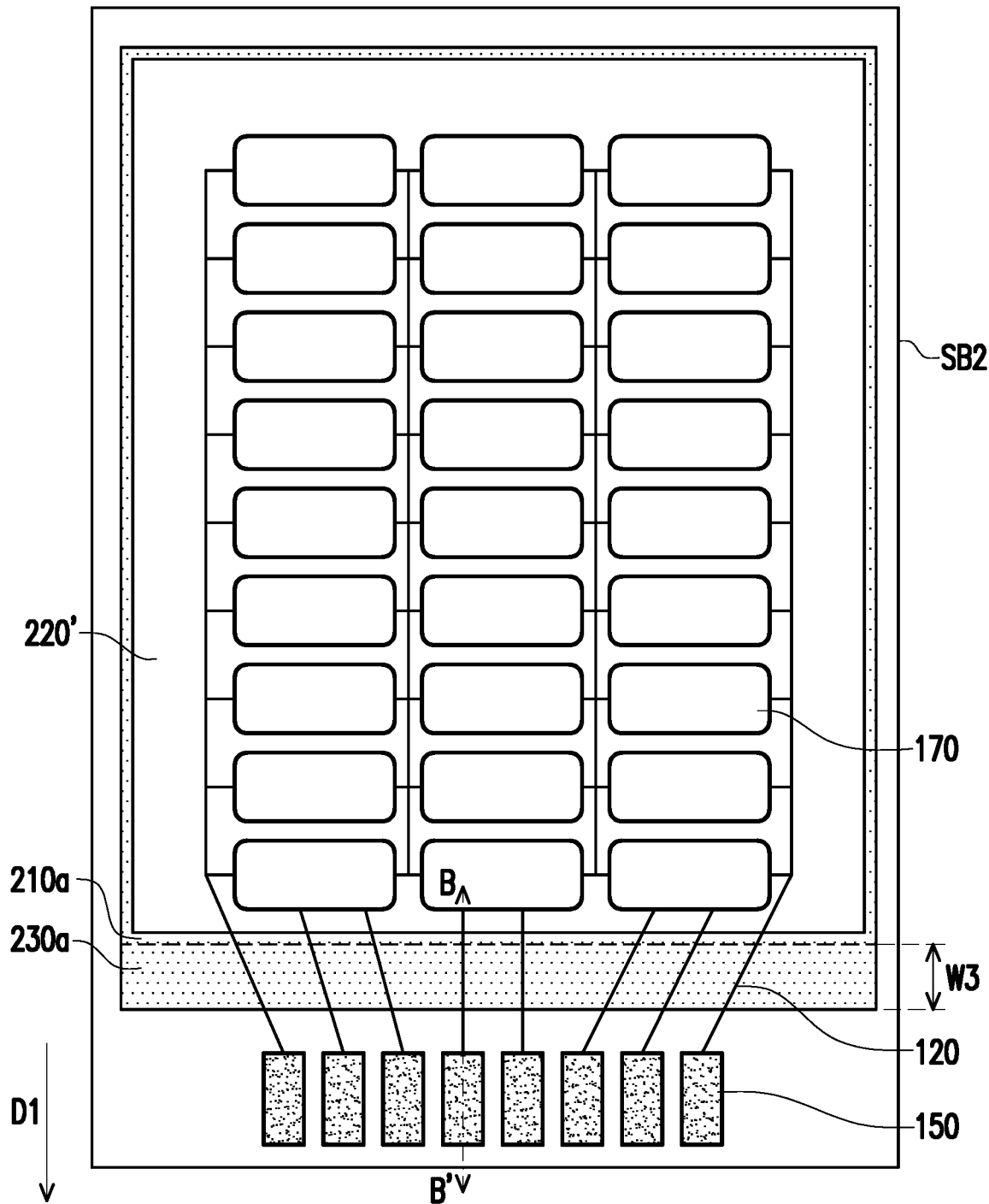
FIG. 4 is a top view of a display device according to an embodiment of the invention.

FIG. 3 is a cross-sectional view of a display device according to an embodiment of the invention. FIG. 4 is a schematic top view of a display device according to an embodiment of the invention, wherein FIG. 3 corresponds to the position of line B-B' of FIG. 4.

It should be mentioned here that, the embodiment of FIG. 3 and FIG. 4 adopts the reference numerals of the embodiment of FIG. 1A to FIG. 2 and a portion of the contents thereof, wherein the same or similar numerals are used to represent the same or similar elements and descriptions of the same technical contents are omitted. The omitted portions are as described in the above embodiments and are not repeated herein.

The difference between a display device 2 of FIG. 3 and FIG. 4 and the display device 1 of FIG. 1L and FIG. 2 is that a retaining wall 210a and a support structure 230a of the display device 2 are integrally formed.

In the present embodiment, first, the retaining wall 210a and the support structure 230a are formed at the same time, and then the encapsulant 220' is formed in an area surrounded by the retaining wall 210a.

In the present embodiment, the support structure 230a is laterally located between the light-emitting diode 170 and the bonding pad 150. The support structure 230a has an inclined surface 232a, and the thickness of the support structure 230a close to the light-emitting diode 170 is greater than the thickness of the support structure 230a close to the bonding pad 150.

In the present embodiment, the support structure 230a is located between the bonding pad 150 and the light-emitting diode 170 in the first direction D1, and the width W3 of the support structure 230a in the first direction D1 is greater than the maximum thickness H3 of the support structure 230a. In the present embodiment, the width W3 of the support structure 230a is 1500 μm to 3000 μm. The width W3 of the support structure 230a is, for example, ten times or more than the thickness H3. The width W3 of the support structure 230a is substantially equal to the width of the inclined surface 232a projected perpendicularly to the flexible carrier board SB2.

In the present embodiment, the included angle θ between the inclined surface 232a of the support structure 230a and a bottom surface 234a of the support structure 230a is greater than 0 degrees and less than or equal to 30 degrees, and the included angle θ is preferably from greater than or equal to 5 degrees to less than or equal to 10 degrees.

In the present embodiment, by providing the support structure 230a, a gap between the flexible carrier SB2 and the flexible substrate 100 is avoided.

What is claimed is:

1. A display device, comprising:
   a flexible substrate;
   a bonding pad located on the flexible substrate;
   a light-emitting diode located on the flexible substrate;
   an encapsulant covering the light-emitting diode;
   a support structure laterally located between the light-emitting diode and the bonding pad, wherein the support structure has an inclined surface, and a thickness of the support structure close to the light-emitting diode is greater than the thickness of the support structure close to the bonding pad; and
   a retaining wall surrounding the encapsulant, and the retaining wall is located between the support structure and the encapsulant, wherein the retaining wall and the support structure are integrally formed.

2. The display device of claim 1, wherein the support structure is located between the bonding pad and the light-emitting diode in a first direction, and a width of the support structure in the first direction is greater than a maximum thickness of the support structure.

3. A display device, comprising:
   a flexible substrate;
   a bonding pad located on the flexible substrate;
   a light-emitting diode located on the flexible substrate;
   an encapsulant covering the light-emitting diode;
   a support structure laterally located between the light-emitting diode and the bonding pad, wherein the support structure has an inclined surface, and a thickness of the support structure close to the light-emitting diode is greater than the thickness of the support structure close to the bonding pad; and
   a retaining wall surrounding the encapsulant, and the retaining wall is located between the support structure and the encapsulant, wherein the retaining wall and the support structure are formed separately, and the retaining wall is in direct contact with the support structure.

4. The display device of claim 3, wherein an included angle between the inclined surface of the support structure and a bottom surface of the support structure is from greater than 0 degrees to less than or equal to 30 degrees.

5. The display device of claim 3, wherein a thickness of the retaining wall is substantially equal to a maximum thickness of the support structure, and the thickness of the retaining wall is greater than a thickness of the encapsulant.

6. A manufacturing method of a display device, comprising:
   providing a pixel circuit on a rigid carrier board, the pixel circuit comprising:
      a flexible substrate;
      a bonding pad located on the flexible substrate; and
      a light-emitting diode located on the flexible substrate;
   forming a retaining wall on the pixel circuit;
   forming an encapsulant material on the pixel circuit to cover the light-emitting diode, wherein the encapsulant material is formed in an area surrounded by the retaining wall;
   curing the encapsulant material to form an encapsulant;
   forming a support structure material on the pixel circuit, wherein the support structure material is laterally located between the light-emitting diode and the bonding pad;
   curing the support structure material to form a support structure, wherein the support structure has an inclined surface, and a thickness of the support structure close to the light-emitting diode is greater than the thickness of the support structure close to the bonding pad, wherein the retaining wall and the support structure are formed separately, and the retaining wall is in direct contact with the support structure;
   providing a protective layer on the inclined surface of the support structure and the encapsulant;
   removing the rigid carrier board; and
   adhering the pixel circuit on a flexible carrier board.

7. The manufacturing method of the display device of claim 6, wherein a viscosity of the support structure material is greater than a viscosity of the encapsulant material.

8. The manufacturing method of the display device of claim 6, further comprising:
   removing the protective layer.

9. The manufacturing method of the display device of claim 6, wherein a method of forming the support structure material on the pixel circuit comprises a doctor blade forming method.

* * * * *